(12) United States Patent
Fu et al.

(10) Patent No.: US 10,163,700 B2
(45) Date of Patent: Dec. 25, 2018

(54) METHOD FOR FORMING CONDUCTIVE STRUCTURE USING POLISHING PROCESS

(71) Applicant: Taiwan Semiconductor Manufacturing Co., Ltd., Hsinchu (TW)

(72) Inventors: Shih-Kang Fu, Taoyuan (TW); Ming-Han Lee, Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 14/989,036

(22) Filed: Jan. 6, 2016

(65) Prior Publication Data

US 2017/0194201 A1    Jul. 6, 2017

(51) Int. Cl.
  *H01L 21/768*   (2006.01)
  *H01L 23/522*   (2006.01)
  *H01L 23/528*   (2006.01)
  *H01L 29/06*    (2006.01)
  *H01L 21/3105*  (2006.01)
  *H01L 21/321*   (2006.01)

(52) U.S. Cl.
  CPC .... *H01L 21/76883* (2013.01); *H01L 21/7684* (2013.01); *H01L 21/7688* (2013.01); *H01L 21/76834* (2013.01); *H01L 21/76879* (2013.01); *H01L 23/528* (2013.01); *H01L 23/5226* (2013.01); *H01L 29/0692* (2013.01); H01L 21/31053 (2013.01); H01L 21/3212 (2013.01); H01L 21/76885 (2013.01); H01L 23/5283 (2013.01)

(58) Field of Classification Search
  CPC ........... H01L 21/76883; H01L 23/5226; H01L 21/7688; H01L 23/528; H01L 21/7684; H01L 21/76879; H01L 21/76834
  See application file for complete search history.

(56) References Cited

U.S. PATENT DOCUMENTS

| | | | | |
|---|---|---|---|---|
| 5,244,534 A * | 9/1993 | Yu | ............... | C23F 3/00 257/E21.304 |
| 6,103,569 A * | 8/2000 | Teo | ............... | H01L 21/7684 257/E21.304 |
| 6,225,223 B1 * | 5/2001 | Liu | ............... | H01L 21/7684 257/E21.583 |
| 6,274,485 B1 * | 8/2001 | Chen | ............... | H01L 21/7684 257/E21.583 |
| 6,372,632 B1 * | 4/2002 | Yu | ............... | H01L 21/31053 257/E21.244 |

(Continued)

*Primary Examiner* — David Vu
(74) *Attorney, Agent, or Firm* — Birch, Stewart, Kolasch & Birch, LLP

(57) ABSTRACT

Semiconductor structures and methods for forming the same are provided. The method for manufacturing a semiconductor structure includes forming a dielectric layer over a substrate and forming a sacrificial layer over the dielectric layer. The method for manufacturing a semiconductor structure further includes forming a trench through the sacrificial layer and the dielectric layer and forming a conductive structure in the trench. The method for manufacturing a semiconductor structure further includes removing the sacrificial layer. In addition, a top surface of the conductive feature is not level with a top surface of the dielectric layer after the sacrificial layer is removed.

19 Claims, 14 Drawing Sheets

(56) References Cited

U.S. PATENT DOCUMENTS

| | | | |
|---|---|---|---|
| 6,503,827 B1 * | 1/2003 | Bombardier | H01L 21/76834 257/E21.583 |
| 7,223,693 B2 * | 5/2007 | Choi | H01L 21/76816 257/71 |
| 2002/0151167 A1 * | 10/2002 | Farkas | H01L 21/02074 438/618 |
| 2012/0164918 A1 | 6/2012 | Lee et al. | |
| 2013/0061876 A1 | 3/2013 | Suen et al. | |

* cited by examiner

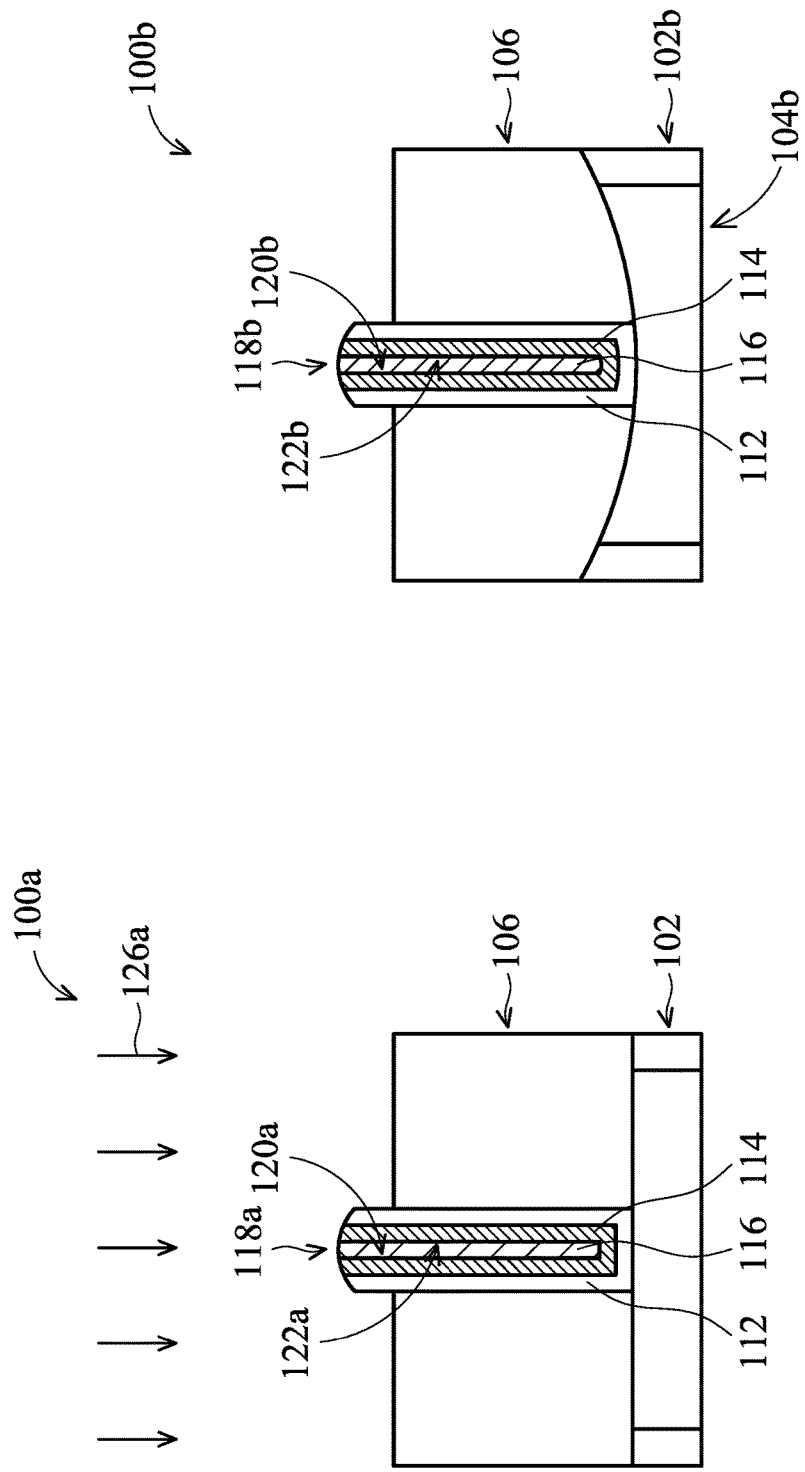

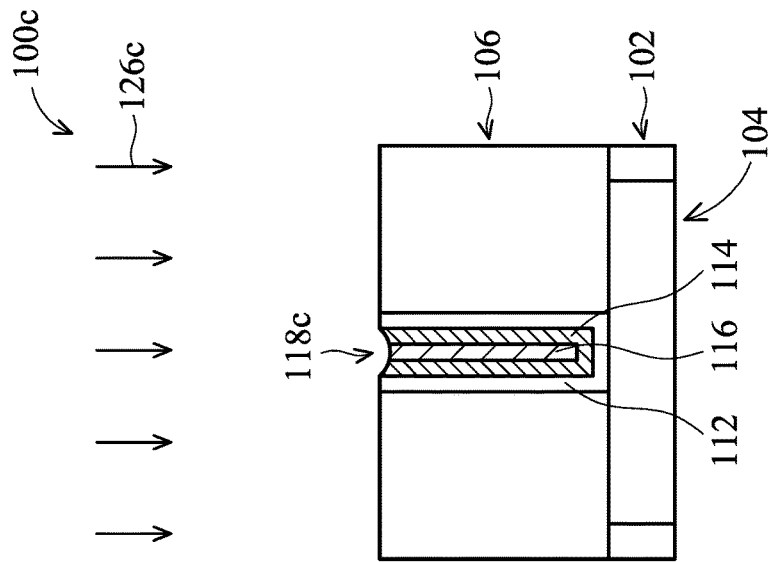
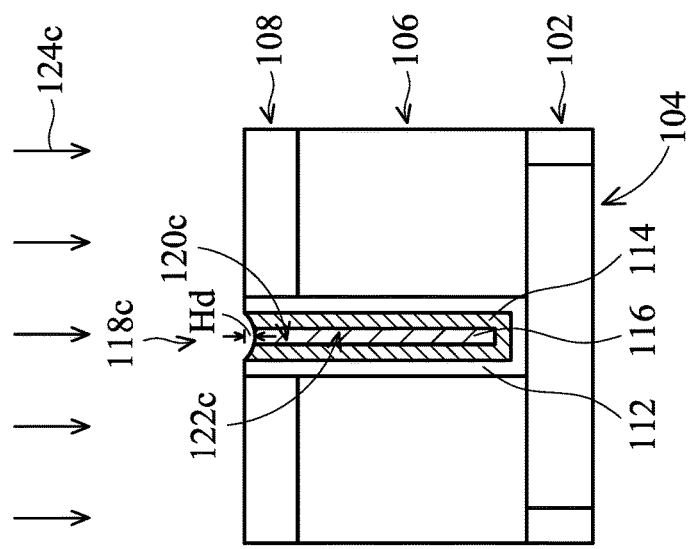

METHOD FOR FORMING CONDUCTIVE STRUCTURE USING POLISHING PROCESS

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in semiconductor devices is the higher levels of integration of circuits. This is accomplished by miniaturizing or shrinking device sizes on a given chip. As feature densities in semiconductor devices increase, the widths of the conductive lines and the spacing between the conductive lines and interconnect structures in the semiconductor devices also need to be scaled down.

Although existing methods for forming interconnect structures have been generally adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A to 1G are cross-sectional representations of various stages of forming a semiconductor structure in accordance with some embodiments.

FIG. 2 is a cross-sectional representation of a semiconductor structure in accordance with some embodiments.

FIGS. 3A to 3B are cross-sectional representations of various stages of forming a semiconductor structure in accordance with some embodiments.

DETAILED DESCRIPTION

Figure 1B:
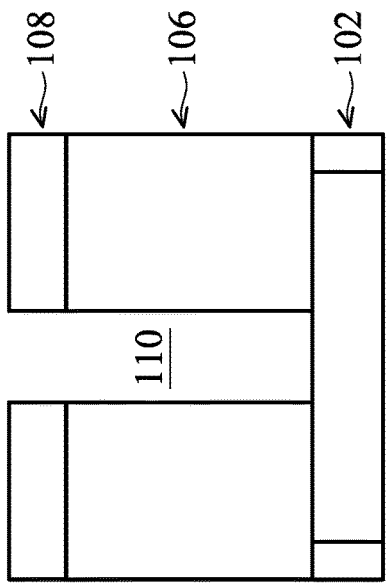

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments for forming a semiconductor structure are provided. The semiconductor structure includes a conductive structure formed through a dielectric layer. In addition, during the formation of the semiconductor structure, a sacrificial layer is formed, so that the top surface of the resulting conductive structure is not level with the dielectric layer.

Figure 1A:
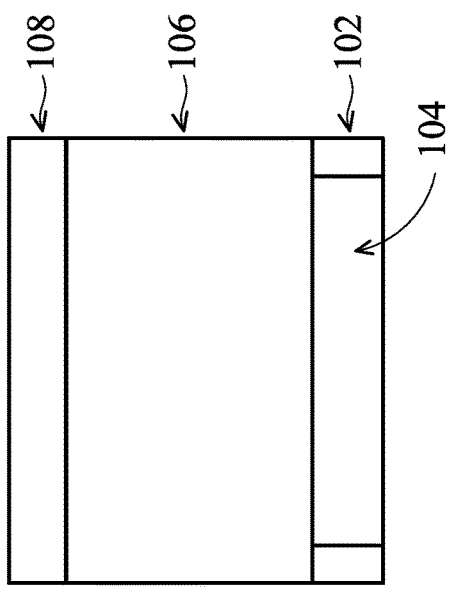

FIGS. 1A to 1G are cross-sectional representations of various stages of forming a semiconductor structure 100a in accordance with some embodiments. As shown in FIG. 1A, a substrate 102 is received in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, the substrate 102 may include structures such as doped regions, interlayer dielectric (ILD) layers, conductive features, and/or isolation structures. Furthermore, the substrate 102 may further include single or multiple material layers to be patterned. For example, the material layers may include a silicon layer, a dielectric layer, and/or a doped poly-silicon layer.

In some embodiments, the substrate 102 includes a device region 104, as shown in FIG. 1A. The device region 104 may have various device elements. Examples of device elements may include, but are not limited to, transistors, diodes, and other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes are performed to form the device elements, such as deposition, etching, implantation, photolithography, annealing, and other applicable processes.

A dielectric layer 106 is formed over the substrate 102, as shown in FIG. 1A in accordance with some embodiments. In some embodiments, the dielectric layer 106 is an interlayer dielectric layer or an intermetal dielectric layer. The dielectric layer 106 may include multilayers made of multiple dielectric materials, such as low dielectric constant or extreme low dielectric constant (ELK) materials. In some embodiments, the dielectric layer 106 is made of silicon oxide, silicon nitride, silicon oxynitride, phosphosilicate glass (PSG), borophosphosilicate glass (BPSG), and/or other applicable low-k dielectric materials.

In some embodiments, the dielectric layer 106 is formed by performing a chemical vapor deposition (CVD) process, a physical vapor deposition (PVD) process, an atomic layer deposition (ALD) process, a spin-on coating process, or other applicable processes.

After the dielectric layer 106 is formed, a sacrificial layer 108 is formed over the dielectric layer 106, as shown in FIG. 1A in accordance with some embodiments. In some embodiments, the sacrificial layer 108 and the dielectric layer 106 are made of different materials, so that they can have good polishing selectivity in the subsequent polishing process (Details will be described later). In some embodiments, the sacrificial layer 108 is made of oxide.

In some embodiments, the sacrificial layer 108 has a thickness in a range from about 50 Å to about 300 Å. The thickness of the sacrificial layer 108 may determine the height of the conductive structure formed in the dielectric layer 106 afterwards (Details will be described later).

After the dielectric layer 106 and the sacrificial layer 108 are formed over the substrate 102, a trench 110 is formed through the dielectric layer 106 and the sacrificial layer 108, as shown in FIG. 1B in accordance with some embodiments. In some embodiments, the trench 110 has a width in a range from about 10 nm to about 50 µm. In some embodiments, the trench 110 has a thickness in a range from about 150 Å to about 1000 Å.

Figure 1D:
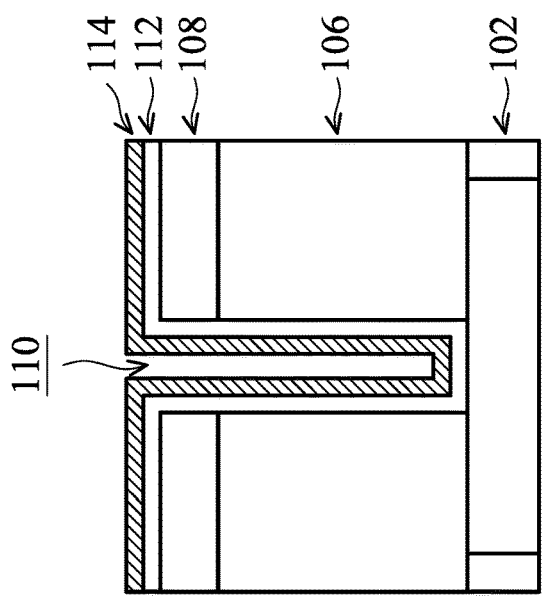
Figure 1C:
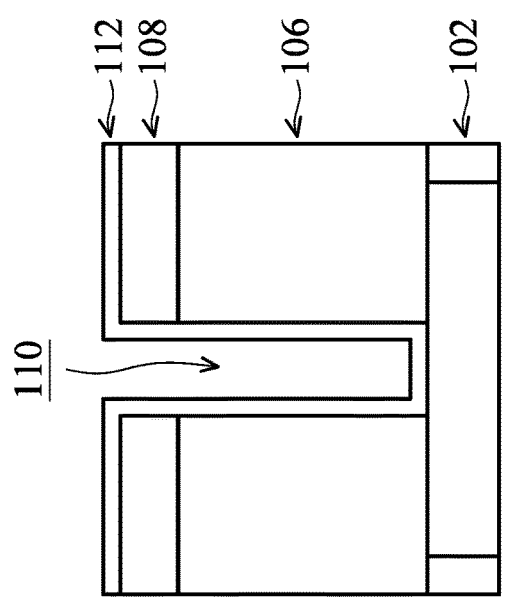

Next, a barrier layer 112 is formed conformally over the substrate 102, as shown in FIG. 1C in accordance with some embodiments. More specifically, the barrier layer 112 is formed on the sidewalls and the bottom surface of the trench 110 and on the top surface of the sacrificial layer 108. In some embodiments, the barrier layer 112 has a thickness in a range from about 5 Å to about 50 Å. The barrier layer 112 should be thick enough to block the conductive material formed thereon from diffusing into the dielectric layer 106. On the other hand, the barrier layer 112 may not be too thick, or the trench 110 may be blocked by the barrier layer 112.

In some embodiments, the barrier layer 112 is made of tantalum nitride, although other materials, such as tantalum, titanium, titanium nitride, or the like, may also be used. The barrier layer 112 may be formed by performing a chemical vapor deposition (CVD) process, a physical vapor deposition (PVD) process, a plasma enhanced CVD (PECVD) process, a plasma enhanced physical vapor deposition (PEPVD) process, an atomic layer deposition (ALD) process, or any other applicable deposition processes.

After the barrier layer 112 is formed, a seed layer 114 is formed over the barrier layer 112, as shown in FIG. 1D in accordance with some embodiments. In some embodiments, the seed layer 114 is made of Cu, Co, Al, Ag, or the like. The seed layer 114 may be formed by performing a chemical vapor deposition (CVD) process, a physical vapor deposition (PVD) process, a plasma enhanced CVD (PECVD) process, a plasma enhanced physical vapor deposition (PEPVD) process, an atomic layer deposition (ALD) process, or any other applicable deposition processes.

In some embodiments, the seed layer 114 has a thickness in a range from about 25 Å to about 35 Å. The seed layer 114 should not be too thick, or the trench 110 may be blocked by the seed layer 114. On the other hand, the seed layer 114 may not be too thin, or the resistance may be too high.

Figure 1F:
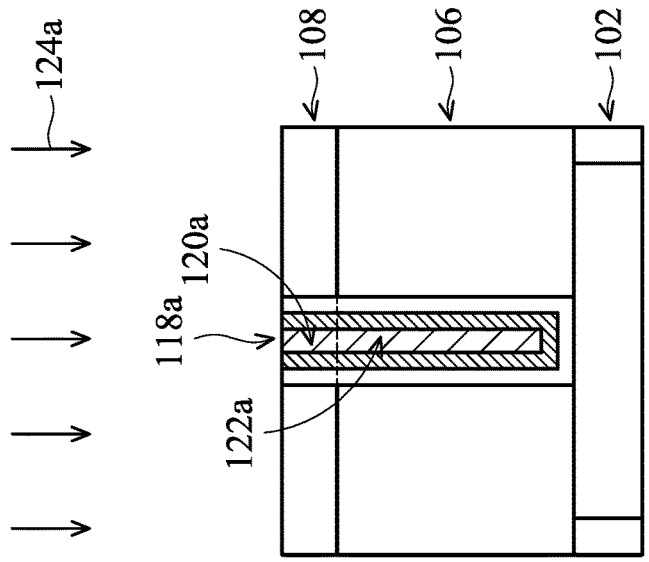
Figure 1E:
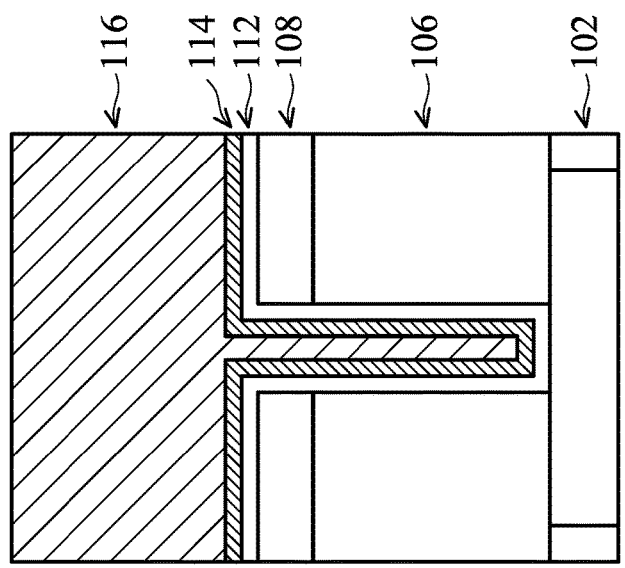

Next, a conductive material 116 is formed over the seed layer 114, as shown in FIG. 1E in accordance with some embodiments. More specifically, the conductive material 116 is formed in the trench 110 and over the sacrificial layer 108. In addition, the trench 110 is fully filled with the conductive material 116.

In some embodiments, the conductive material 116 is copper. In some embodiments, the conductive material 116 is aluminum, copper, tungsten, titanium, tantalum, titanium nitride, tantalum nitride, nickel silicide, cobalt silicide, TaC, TaSiN, TaCN, TiAl, TiAlN, or other applicable materials.

In some embodiments, the conductive material 116 is formed by performing an electrochemical plating process. In some embodiments, the conductive material 116 is formed by performing a spin-on coating process, a CVD process, a PVD process, or other applicable deposition or coating processes.

In some embodiments, the conductive material 116 has a thickness in a range from about 600 Å to about 10000 Å. The conductive material 116 may be relatively thick, so that the top surface of the conductive material 116 may become relatively flat.

Afterwards, the top portion of the conductive material 116 is removed to form a conductive structure 118a in the trench 110, as shown in FIG. 1F in accordance with some embodiments. In some embodiments, the top portion of the conductive material 116 is removed by performing a first polishing process 124a. In some embodiments, the first polishing process 124a is a chemical mechanical polishing process. In some embodiments, the first polishing process 124a is performed until the top surface of the sacrificial layer 108 is exposed. That is, an end-point detection is applied to the first polishing process 124a. In some embodiments, the first polishing process 124a is performed until the top surface of the barrier layer 112 is exposed.

In some embodiments, the conductive structure 118a has a top portion 120a formed in the sacrificial layer 108 and a bottom portion 122a formed in the dielectric layer 106. After the first polishing process 124a is performed, the top surface of the conductive structure 118a is substantially level with the top surface of the sacrificial layer 108.

Next, the sacrificial layer 108 is removed, as shown in FIG. 1G in accordance with some embodiments. In some embodiments, the sacrificial layer 108 is removed by performing a second polishing process 126a. In some embodiments, the second polishing process 126a is a chemical mechanical polishing process.

The slurry used during the second polishing process 126a is chosen so that the sacrificial layer 108 tends to be removed by the slurry while the conductive structure 118a does not. In some embodiments, a polishing selectivity of the sacrificial layer 108 to the conductive structure 116 during the second polishing process 126a is greater than about 3. In some embodiments, a polishing selectivity of the sacrificial layer 108 to the conductive structure 116 during the second polishing process 126a is in a range from about 3 to about 7.

In some embodiments, a polishing selectivity of the sacrificial layer 108 to the dielectric layer 106 during the second polishing process 126a is greater than about 3. In some embodiments, a polishing selectivity of the sacrificial layer 108 to the dielectric layer 106 during the second polishing process 126a is in a range from about 3 to about 7.

The shape of the conductive structure 118a may be controlled by the polishing selectivity of different materials during the second polishing process 126a. For example, during the second polishing process 126a, the sacrificial layer 108 is removed but the top portion 120a of the conductive structure 118a and the dielectric layer 106 substantially remains. Accordingly, the height of the top portion 120a protruding from the dielectric layer 106 is substantially equal to the thickness of the sacrificial layer 108 in accordance with some embodiments.

In some embodiments, the sacrificial layer 108 is completely removed during the second polishing process 126a, while only a portion of the top portion 120a of the conductive structure 118a is removed during the second polishing process 126a. Therefore, the height of the top portion 120a protruding from the dielectric layer 106 is smaller than the thickness of the sacrificial layer 108 in accordance with some embodiments.

In some embodiments, the first polishing process 124a and the second polishing process 126a are both chemical mechanical polishing processes, but the slurry used in the first polishing process 124a is different from the slurry used in the second polishing process 126a. In some embodiments, the first polishing process 124a is performed at a pH value smaller than the pH value that the second polishing process 126a is performed under. In some embodiments, the first polishing process 124a is performed at a pH value in a range from about 6 to about 8. In some embodiments, the second polishing process 126a is performed at a pH value in a range from about 7 to about 11. The shape of the conductive structure 118a may be adjusted by performing the first polishing process 124a and the second polishing process 126a sequentially.

As shown in FIG. 1G, the semiconductor structure 100a includes the conductive structure 118a formed through the dielectric layer 106. In addition, the top surface of the conductive structure 118a is not level with the top surface of the dielectric layer 106 in accordance with some embodiments. In some embodiments, the conductive structure 118a has a convex top surface (i.e. concave downward).

As described previously, the conductive structure 118a is first formed in the dielectric layer 106 and the sacrificial layer 108 and the sacrificial layer 108 is removed afterwards. After the second polishing process 126a, the sacrificial layer 106 is removed, and the top portion 120s of the conductive structure 118a protrudes from the dielectric layer 106.

The conductive structure 118a having the top portion 120a protruding from the dielectric layer 106 may provide a greater contact surface for connecting with other conductive features. In addition, the protruding top portion 120a of the conductive structure 118a may be formed to compensate the non-flat top surface or insufficient height of the structure below. For example, when the top surface of the device region 104 is caved (e.g. concave) due to the manufacturing processes of forming devices in the device region, the additional height of the top portion 120 of the conductive structure 118a may compensate the defect. Therefore, the performance of the resulting semiconductor structure 100a may be improved.

In some embodiments, the conductive structure 118a is a conductive feature formed in an interconnect structure. In some embodiments, the conductive structure 118a is a contact connecting to a transistor.

FIG. 2 is a cross-sectional representation of a semiconductor structure 100b in accordance with some embodiments. Processes and materials used to form the semiconductor structure 100b may be similar to, or the same as, those used to form the semiconductor structure 100a described above and are not repeated herein.

The semiconductor structure 100b may be substantially the same as the semiconductor structure 100a, except a device region 104b in a substrate 102b has a concave top surface, as shown in FIG. 2 in accordance with some embodiments.

More specifically, the semiconductor structure 100b includes a conductive structure 118b formed through the dielectric layer 106 over the substrate 102b. In addition, the conductive structure 118b includes a bottom portion 122b formed in the dielectric layer 106 and a top portion 120b protruding from the dielectric layer 106.

As described previously, the protruding top portion 120b may be used to compensate the concave top surface of the substrate 102b. For example. When the device region 104b has a concave top surface, the top portion 120b of the conductive structure 118b may have a convex top surface to compensate the height. In some embodiments, the conductive structure 118b has a convex top surface (e.g. concave downward) and a concave bottom surface (e.g. concave upward). The risks of forming short circuit may be reduced accordingly, and the performance of the semiconductor structure 100b may be improved.

FIGS. 3A to 3B are cross-sectional representations of various stages of forming a semiconductor structure 100c in accordance with some embodiments. Some processes and materials used to form the semiconductor structure 100c may be similar to, or the same as, those used to form semiconductor structure 100a described previously and are not repeated herein.

For example, the processes shown in FIGS. 1A to 1E may be performed. Afterwards, a first polishing process 124c is performed to form a conductive structure 118c, as shown in FIG. 3A in accordance with some embodiments. The first polishing process 124c may be similar to the first polishing process 124a, but the polishing rate of the conductive structure 118c in the first polishing process 124c may be higher than that in the first polishing process 124a. Therefore, after the first polishing process 124c is performed, the conductive structure 118c has a convex top surface in accordance with some embodiments.

As shown in FIG. 3A, the conductive structure 118c has a top portion 120c formed in the sacrificial layer 108 and a bottom portion 122c formed in the dielectric layer 106. After the first polishing process 124c is performed, a second polishing process 126c is performed to remove the sacrificial layer 108, as shown in FIG. 3B in accordance with some embodiments. Similar to the second polishing process 126a, the second polishing process 126c may also be a chemical mechanical polishing process.

However, unlike the second polishing process 126a, both the sacrificial layer 108 and the top portion 120c of the conductive structure 118c are removed during the second polishing process 126c. That is, the polishing rate of the conductive structure 118 (e.g. the conductive material 116) during the second polishing process 126c may be higher than that during the second polishing process 126a described previously.

In some embodiments, a polishing selectivity of the sacrificial layer 108 to the conductive structure 118c during the second polishing process 126c is greater than about 3. In some embodiments, a polishing selectivity of the sacrificial layer 108 to the conductive structure 118c during the second polishing process 126c is in a range from about 3 to about 7. In some embodiments, a polishing selectivity of the sacrificial layer 108 to the dielectric layer 106 during the second polishing process 126c is greater than about 2. In some embodiments, a polishing selectivity of the sacrificial layer 108 to the dielectric layer 106 during the second polishing process 126c is in a range from about 2 to about 6.

As shown in FIG. 3B, the semiconductor structure 100c includes the conductive structure 118c formed through the dielectric layer 106. In addition, the top surface of the conductive structure 118c is not level with the top surface of the dielectric layer 106 in accordance with some embodiments. In some embodiments, the conductive structure 118c has a concave top surface (i.e. concave upward). In some embodiments, the height's difference Hd between the central of the top surface of the conductive structure 118c and the top surface of the dielectric layer 106 is in a range from about 25 Å to about 150 Å.

The conductive structure 118c with the concave top surface may be formed to compensate the non-flat surface below. For example, when the device region 104 has a convex top surface (concave downward) due to the manufacturing processes of forming devices in the device region, the conductive structure 118c having the concave top surface may be used to compensate the defect. Therefore, the performance of the resulting semiconductor structure 100c may be improved.

Figure 4:
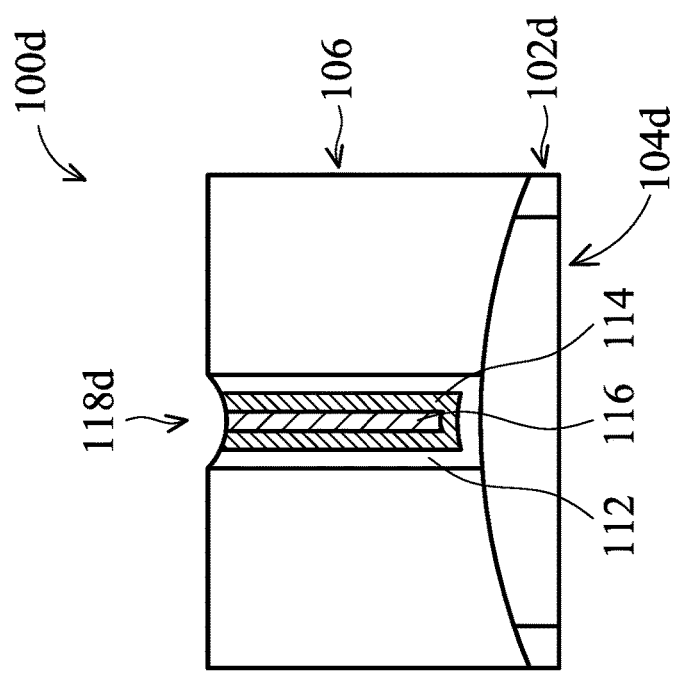
FIG. 4 is a cross-sectional representation of a semiconductor structure in accordance with some embodiments.

FIG. 4 is a cross-sectional representation of a semiconductor structure 100d in accordance with some embodiments. Processes and materials used to form the semiconductor structure 100d may be similar to, or the same as, those used to form the semiconductor structure 100c described above and are not repeated herein.

The semiconductor structure 100d may be substantially the same as the semiconductor structure 100c, except a device region 104d in a substrate 102d has a convex top surface, as shown in FIG. 4 in accordance with some embodiments.

More specifically, the semiconductor structure 100d includes a conductive structure 118d formed through the dielectric layer 106 over the substrate 102d. As described previously, the conductive structure 118d having the concave top surface may be used to compensate the convex top surface of the substrate 102b. In some embodiments, the conductive structure 118d has a concave top surface (e.g. concave upward) and a convex bottom surface (e.g. concave downward). The risks of forming short circuit may be reduced accordingly, and the performance of the semiconductor structure 100d may be improved.

FIGS. 5A to 5D are cross-sectional representations of various stages of forming a semiconductor structure 100e in accordance with some embodiments. Some processes and materials used to form the semiconductor structure 100e may be similar to, or the same as, those used to form the semiconductor structure 100a described previously and are not repeated herein.

Figure 5A:
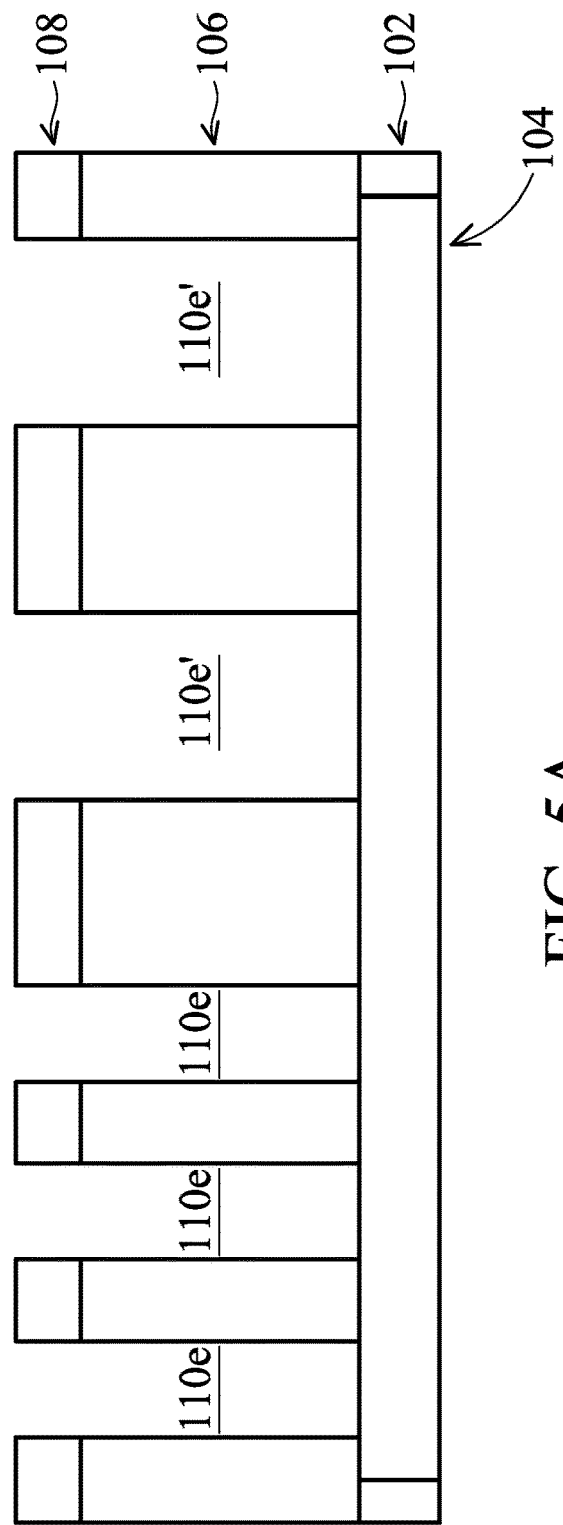
FIGS. 5A to 5D are cross-sectional representations of various stages of forming a semiconductor structure in accordance with some embodiments.

Similar to those shown in FIGS. 1A and 1B, the dielectric layer 106 and the sacrificial layer 108 are formed over the substrate 102. Afterwards, narrow trenches 110e and wide trenches 110e' are formed through the sacrificial layer 108 and the dielectric layer 106, as shown in FIG. 5A in accordance with some embodiments.

In some embodiments, the width of narrow trench 110e is smaller than the width of wide trench 110e'. In some embodiments, each narrow trench 110e has a width in a range from about 10 nm to about 60 nm. In some embodiments, each wide trench 110e' has a width in a range from about 60 nm to about 50 μm.

Figure 5B:
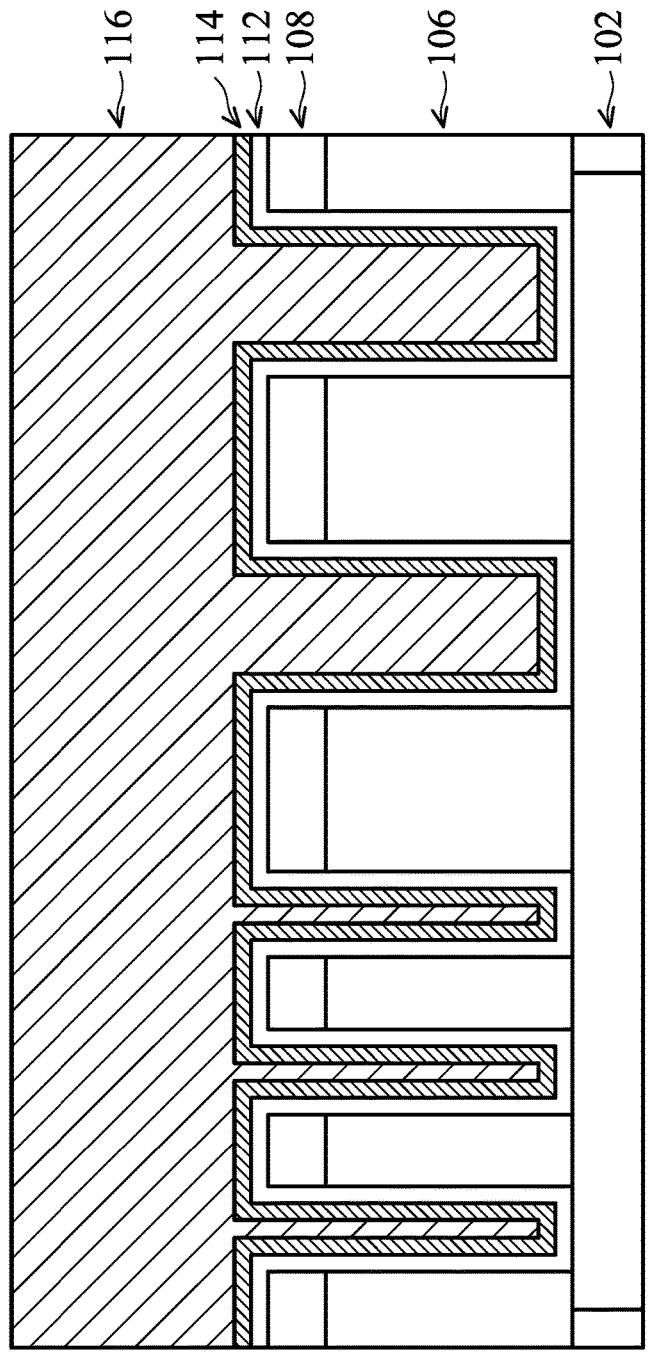

After the narrow trenches 110e and the wide trenches 110e' are formed, the barrier layer 112, the seed layer 114, and the conductive material 116 are conformally formed over the substrate 102, as shown in FIG. 5B in accordance with some embodiments. The processes and materials used to form the barrier layer 112, the seed layer 114, and the conductive material 116 may be similar to, or the same as, those shown in FIGS. 1C to 1E.

Figure 5C:
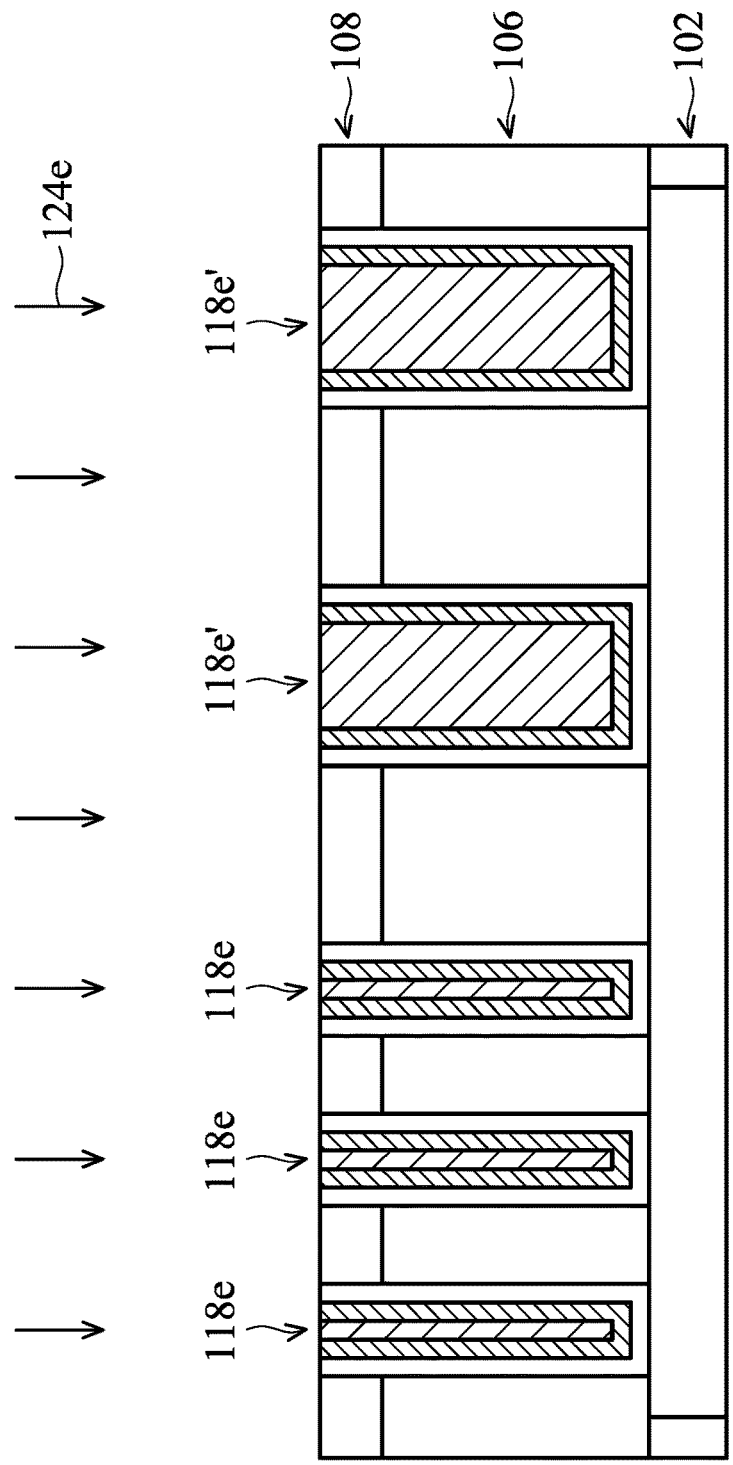

Next, the top portion of the conductive material 116 is removed to form narrow conductive structures 118e in the narrow trenches 110e and wide conductive structures 118e' in the wide trenches 110e', as shown in FIG. 5C in accordance with some embodiments.

In some embodiments, the top portion of the conductive material 116 is removed by performing a first polishing process 124e. In some embodiments, the first polishing process 124e is a chemical mechanical polishing process. The first polishing process 124e may be similar to, or the same as, the first polishing process 124a described previously. After the first polishing process 124e is performed, the top surfaces of the narrow conductive structures 118e and wide conductive structures 118e' are substantially level with the top surface of the sacrificial layer 108.

Figure 5D:
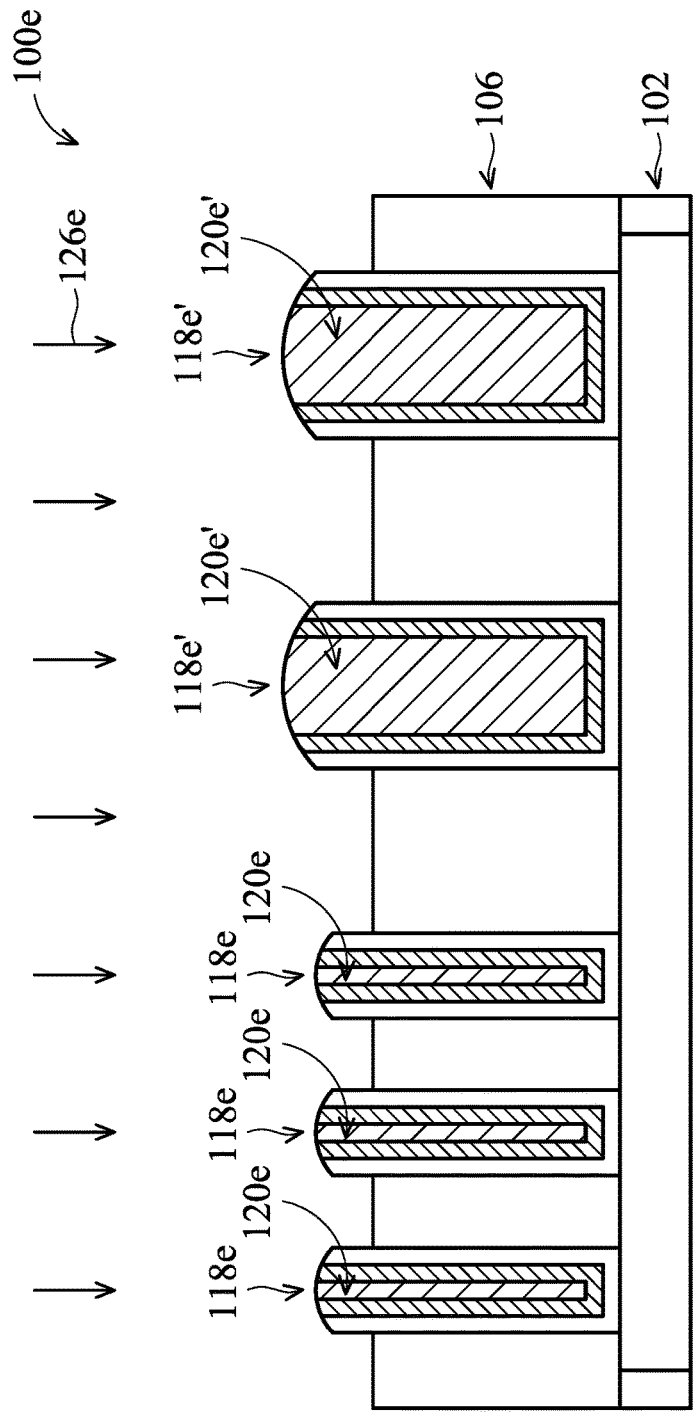

Next, the sacrificial layer 108 is removed, as shown in FIG. 5D in accordance with some embodiments. In some embodiments, the sacrificial layer 108 is removed by performing a second polishing process 126e. In some embodiments, the second polishing process 126e is a chemical mechanical polishing process. The second polishing process 126e may be similar to, or the same as, the second polishing process 126a described previously.

As described previously, the polishing rate of the sacrificial layer 108 is greater than the polishing rate of the conductive material 116 during the second polishing process 124e. Therefore, narrow top portions 120e of the narrow conductive structures 118e and wide top portions 120e' of the wide conductive structure 118e' protrude from the dielectric layer 106.

In addition, since the widths of the narrow conductive structures 118e and wide conductive structures 118e' are different, the heights of the narrow top portions 120e and the wide top portions 120e' protruding from the dielectric layer 106 may also be different. In some embodiments, the height of the wide top portion 120e' of the wide conductive structure 118e' is greater than the height of the narrow top portions 120e of the narrow conductive structure 118e. In some embodiments, the difference between the height of the wide top portion 120e' of the wide conductive structure 118e' and the height of the narrow top portions 120e of the narrow conductive structure 118e is in a range from about 25 Å to about 75 Å.

Figure 6:
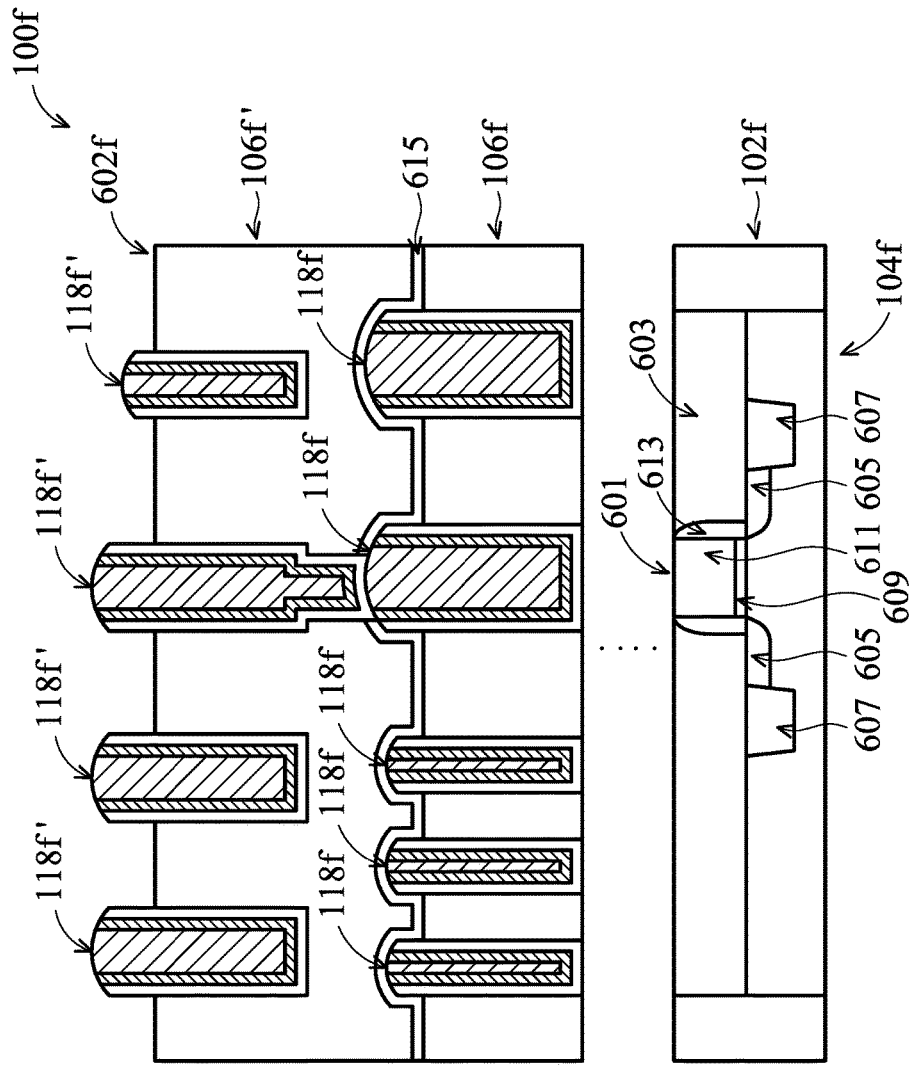
FIG. 6 is a cross-sectional representation of a semiconductor structure in accordance with some embodiments.

FIG. 6 is a cross-sectional representation of a semiconductor structure 100f in accordance with some embodiments. The semiconductor structure 100f includes an interconnect structure 602f formed over a substrate 102f. In addition, the substrate 102f includes a device region 104f in accordance with some embodiments. In some embodiments, the device region 104f includes a gate structure 601 embedded in an interlayer dielectric (ILD) layer 603, source/drain regions 605, and isolation structures 607.

In some embodiments, the gate structure 601 includes a gate dielectric layer 609, a gate electrode 611, and spacers 613. In some embodiments, the gate dielectric layer 609 is made of high k dielectric materials, such as metal oxides, metal nitrides, metal silicates, transition metaloxides, transition metal nitrides, transition metal silicates, oxynitrides of metals, or metal aluminates. Examples of the high k dielectric materials may include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, zirconium oxide, titanium oxide, aluminum oxide, or hafnium dioxide-alumina ($HfO_2$—$Al_2O_3$) alloy.

In some embodiments, the gate electrode 611 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials.

The ILD layer 603 may include multilayers made of multiple dielectric materials, such as silicon oxide, silicon nitride, phosphosilicate glass (PSG), borophosphosilicate glass (BPSG), a low-k dielectric material, and/or other applicable dielectric materials. The ILD layer 603 may be formed by chemical vapor deposition (CVD), physical vapor deposition, (PVD), atomic layer deposition (ALD), spin-on coating, or other applicable processes.

It should be noted that the device region 104f shown in FIG. 6 is merely an example, and other devices may be additionally or alternatively formed in the device region 104f. In addition, some dielectric layers and conductive features may have been omitted in FIG. 6 for clarity.

The interconnect structure 602f may include a number of metal layers formed over the device region 104f of the substrate 102f. In some embodiments, the interconnect structure 602f includes conductive structures 118f formed in a dielectric layer 106f. The conductive structures 118f may be similar to, or the same as, the conductive structure 118a and/or 118b described previously. As shown in FIG. 6, the conductive structures 118f may have various widths, and the top portions of the conductive structures 118f protrude from the dielectric layer 106f.

After the conductive structures 118f are formed, an etch stop layer 615 is conformally formed over the substrate 102f, as shown in FIG. 6 in accordance with some embodiments. More specifically, the etch stop layer 615 is formed on the top surface of the dielectric layer 106f and on the top surface and the sidewalls of the top portion of the conductive structures 118f.

In some embodiments, the etch stop layer 615 is made of silicon nitride, silicon oxynitride, and/or other applicable materials. The etch stop layer 615 may be formed by plasma enhanced CVD, low pressure CVD, ALD, or other applicable processes.

After the etch stop layer 615 is formed, a dielectric layer 106f' is formed over the etch stop layer 615, and conductive structures 118f' are formed through the dielectric layer 106f', as shown in FIG. 6 in accordance with some embodiments. The conductive structures 118f' may be similar to, or the same as, the conductive structure 118a and/or 118b described previously. In some embodiments, the conductive structures 118f' have various widths, and the top portions of the conductive structures 118f' protrude from the dielectric layer 106f'.

As shown in FIG. 6, one conductive structure 118f' formed in the dielectric layer 106f' is connected to one connective structure 118f formed in the dielectric layer 106f. In addition, since the conductive structure 118f has the top portion protruding from the dielectric layer 106f, the electoral connection of the interconnection structure may be improved.

Figure 7:
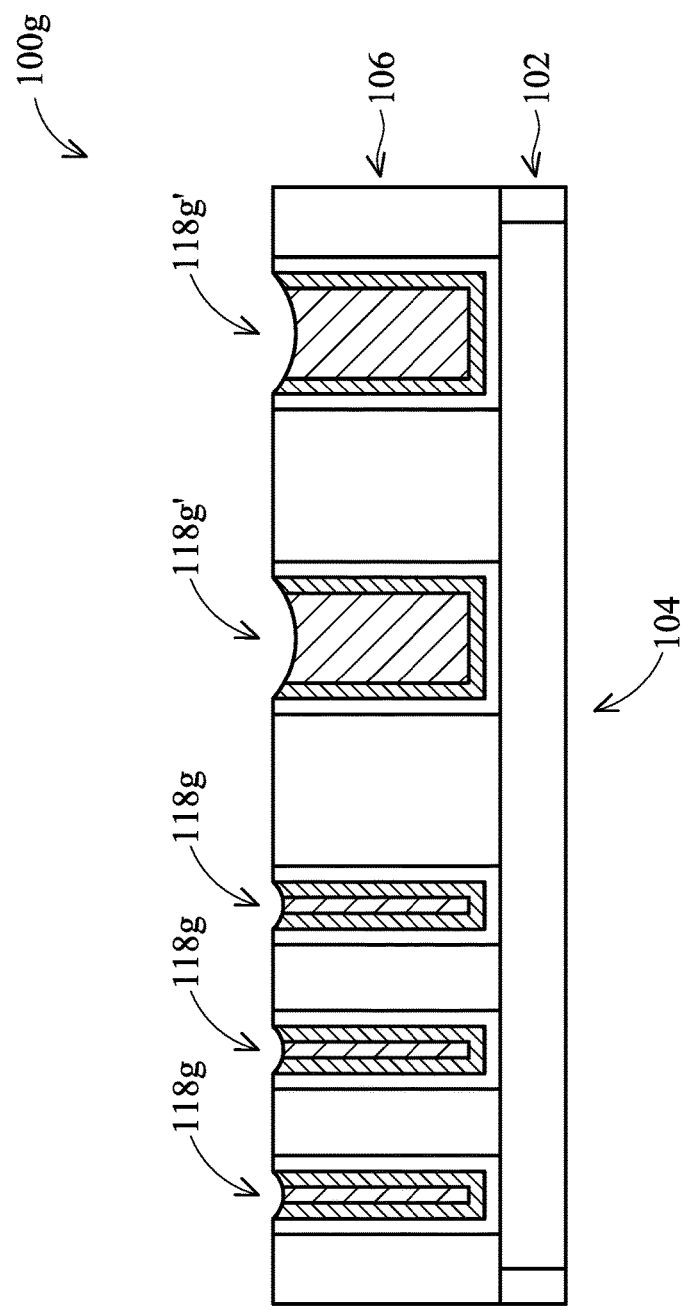
FIG. 7 is a cross-sectional representation of a semiconductor structure in accordance with some embodiments.

FIG. 7 is a cross-sectional representation of a semiconductor structure 100g in accordance with some embodiments. The semiconductor structure 100g is similar to the semiconductor structure 100c, except a number of narrow conductive structures 118g and wide conductive structure 118g' are formed.

The semiconductor structure 100g includes narrow conductive structures 118g and wide conductive structures 118g' formed through the dielectric layer 106. In addition, the top surfaces of the narrow conductive structures 118g and the wide conductive structures 118g' have concave top surfaces. Since the widths of the narrow conductive structures 118g and the wide conductive structures 118g' are different, the height of the narrow conductive structure 118g and the wide conductive structure 118g' may also be different after the second polishing process is performed.

Figure 8:
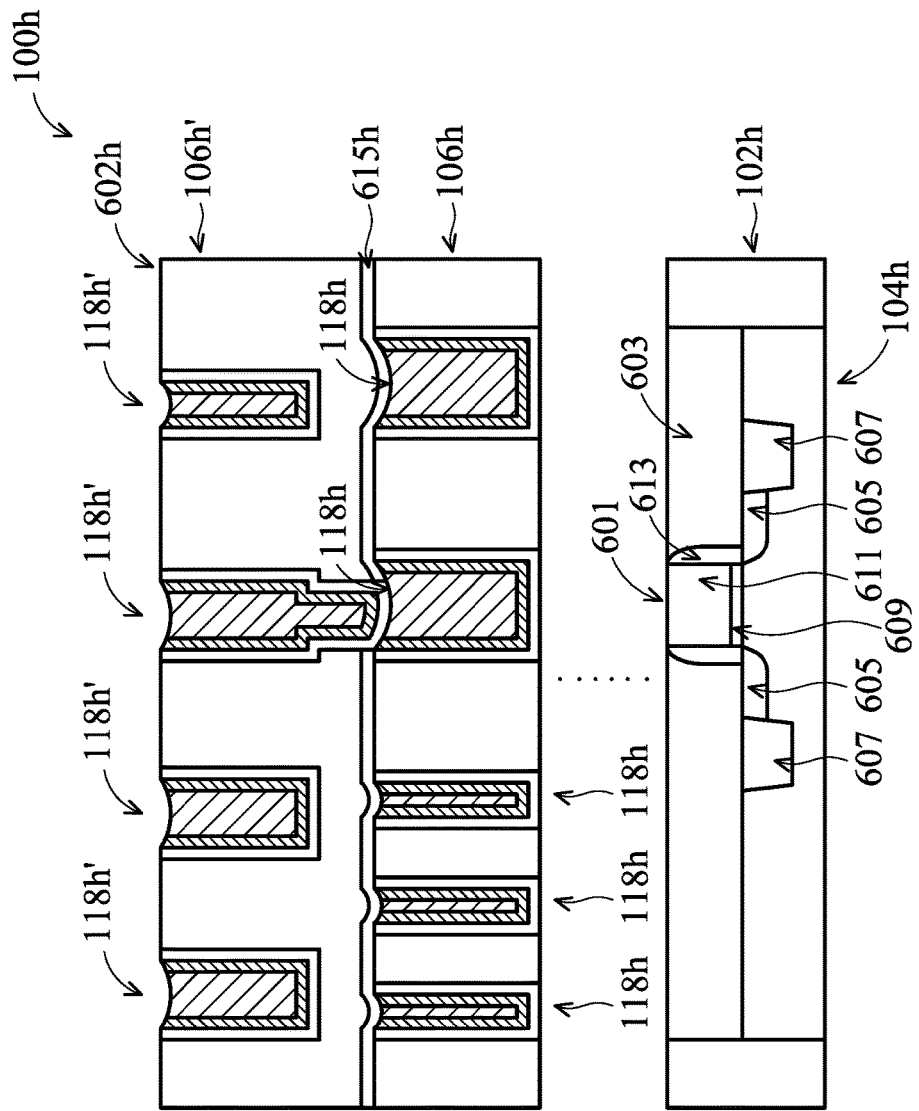
FIG. 8 is a cross-sectional representation of a semiconductor structure in accordance with some embodiments.

FIG. 8 is a cross-sectional representation of a semiconductor structure 100h in accordance with some embodiments. The semiconductor structure 100h includes an interconnect structure 602h formed over a substrate 102h. In addition, the substrate 102h includes a device region 104h in accordance with some embodiments. In some embodiments, the device region 104h includes the gate structure 601 embedded in the interlayer dielectric (ILD) layer 603, the source/drain regions 605, and the isolation structures 607. In some embodiments, the gate structure 601 includes the gate dielectric layer 609, the gate electrode 611, and the spacers 613.

The interconnect structure 602h may include a number of metal layers formed over the device region 104h of the substrate 102h. In some embodiments, the interconnect structure 602h includes conductive structures 118h formed in a dielectric layer 106h. The conductive structures 118h may be similar to, or the same as, the conductive structure 118c and 118d described previously. As shown in FIG. 8, the conductive structures 118h may have various widths, and the top surfaces of the conductive structures 118h are not level with the top surface of the dielectric layer 106h.

After the conductive structures 118h are formed, an etch stop layer 615h is conformally formed over the substrate 102h, as shown in FIG. 8 in accordance with some embodiments. More specifically, the etch stop layer 615h is formed on the top surface of the dielectric layer 106f and on the concave top surfaces of the conductive structures 118h.

After the etch stop layer 615h is formed, a dielectric layer 106h' is formed over the etch stop layer 615h, and conductive structures 118h' are formed through the dielectric layer 106h', as shown in FIG. 8 in accordance with some embodiments. The conductive structures 118h' may be similar to, or the same as, the conductive structure 118c and 118d described previously. As shown in FIG. 8, one conductive structure 118h' formed in the dielectric layer 106h' is connected to one connective structure 118h formed in the dielectric layer 106h.

Figure 9:
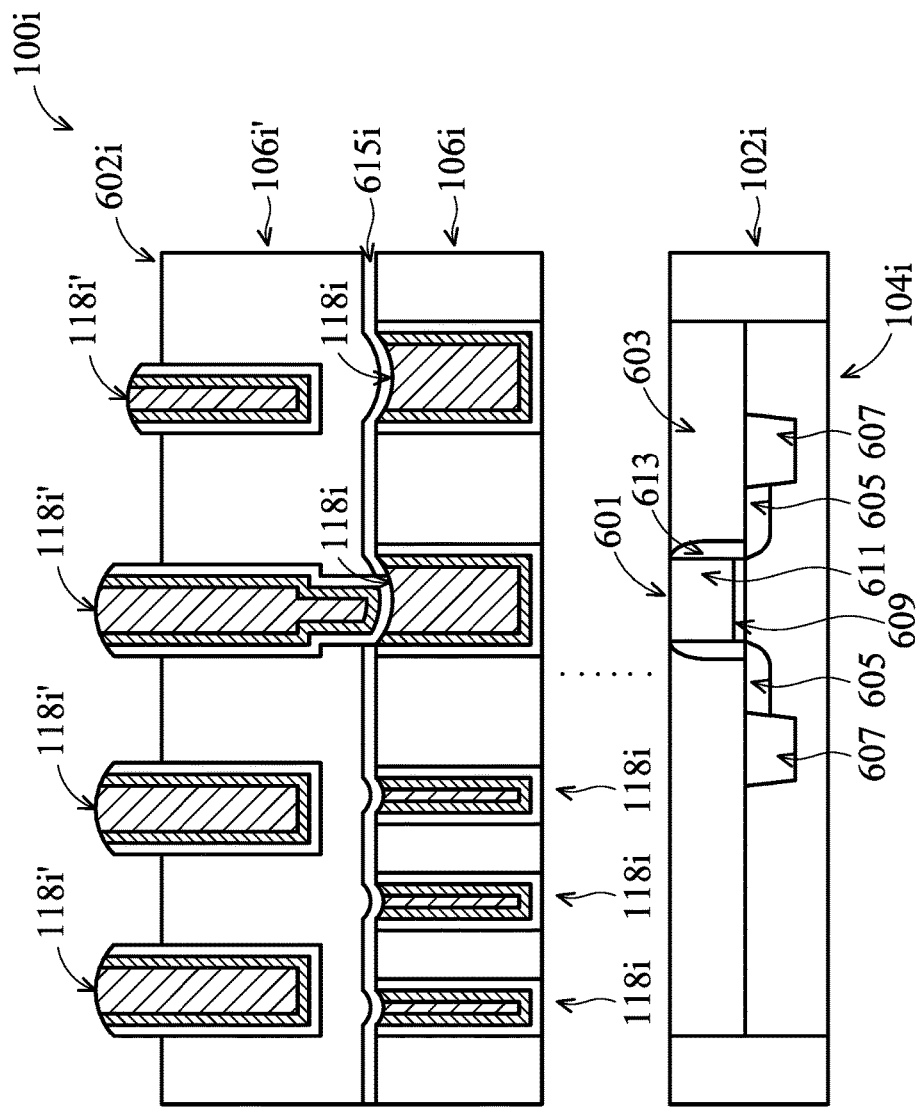
FIG. 9 is a cross-sectional representation of a semiconductor structure in accordance with some embodiments.

FIG. 9 is a cross-sectional representation of a semiconductor structure 100i in accordance with some embodiments. The semiconductor structure 100i includes an interconnect structure 602i formed over a substrate 102i. In addition, the substrate 102i includes a device region 104i in accordance with some embodiments. In some embodiments, the device region 104i includes the gate structure 601 embedded in the interlayer dielectric (ILD) layer 603, the source/drain regions 605, and the isolation structures 607. In some embodiments, the gate structure 601 includes the gate dielectric layer 609, the gate electrode 611, and the spacers 613.

The interconnect structure 602*i* may include a number of metal layers formed over the device region 104*i* of the substrate 102*i*. In some embodiments, the interconnect structure 602*i* includes conductive structures 118*i* formed in a dielectric layer 106*i*. The conductive structures 118*i* may be similar to, or the same as, the conductive structure 118*c* and 118*d* described previously. As shown in FIG. 9, the conductive structures 118*i* may have various widths and concave top surfaces.

After the conductive structures 118*i* are formed, an etch stop layer 615*i* is conformally formed over the substrate 102*i*, as shown in FIG. 9 in accordance with some embodiments. More specifically, the etch stop layer 615*i* is formed on the top surface of the dielectric layer 106*i* and on the concave top surfaces of the conductive structures 118*i*.

After the etch stop layer 615*i* is formed, a dielectric layer 106*i'* is formed over the etch stop layer 615*i*, and conductive structures 118*i'* are formed through the dielectric layer 106*i'*, as shown in FIG. 9 in accordance with some embodiments. The conductive structures 118*i'* may be similar to, or the same as, the conductive structure 118*a* and 118*b* described previously. As shown in FIG. 9, one conductive structure 118*i'* formed in the dielectric layer 106*i'* is connected to one connective structure 118*i* formed in the dielectric layer 106*i*.

As shown in FIGS. 1A to 9 and described previously, a conductive structure (e.g. conductive structures 118*a* to 118*i*) is formed through a dielectric layer (e.g. dielectric layer 106), but the top surface of the conductive structure may not be level with the top surface of the dielectric layer. The conductive structure may be formed by performing a first polishing process (e.g. the first polishing process 124*a* or 124*c*) and a second polishing process (e.g. the second polishing process 126*a* or 126*c*). In addition, the shape of the conductive structure may be controlled by adjusting the first polishing process and second polishing process.

For example, the conductive structure may have a concave top surface or a convex top surface. In some embodiments, the conductive structure has the top portion (e.g. the top portions 120*a*) protruding from the dielectric layer, such that the contact surface of the conductive structure may be increase. Therefore, the performance of the resulting semiconductor structure may be improved.

In addition, the shape of the conductive structure may be adjusted to compensate with the non-flat top surface of the device region (e.g. device regions 104*a* to 104*i*) below the conductive structure. Accordingly, the risks of forming short circuit may be reduced, and the performance of the semiconductor structure may be improved.

Embodiments of a semiconductor structure and methods for forming the same are provided. The method includes forming a conductive structure through a dielectric layer. During the formation of the conductive structure, a polishing process may be performed, such that the resulting conductive structure may have a top surface which is not level with the top surface of the dielectric layer. The conductive structure may be formed over an non-flat surface of a substrate to compensate with the substrate. Therefore, the performance of the semiconductor structure may be improved.

In some embodiments, a method for manufacturing a semiconductor structure is provided. The method for manufacturing a semiconductor structure includes forming a dielectric layer over a substrate and forming a sacrificial layer over the dielectric layer. The method for manufacturing a semiconductor structure further includes forming a trench through the sacrificial layer and the dielectric layer and forming a conductive structure in the trench. The method for manufacturing a semiconductor structure further includes removing the sacrificial layer. In addition, a top surface of the conductive feature is not level with a top surface of the dielectric layer after the sacrificial layer is removed.

In some embodiments, a method for manufacturing a semiconductor structure is provided. The method for manufacturing a semiconductor structure includes forming a dielectric layer over a substrate and forming a sacrificial layer over the dielectric layer. The method for manufacturing a semiconductor structure includes forming a trench through the sacrificial layer and the dielectric layer and forming a conductive material in the trench and over the sacrificial layer. The method for manufacturing a semiconductor structure includes removing a top portion of the conductive material to form a conductive structure in the trench and removing the sacrificial layer such that a top surface of the conductive structure is not level with a top surface of the dielectric layer.

In some embodiments, a semiconductor structure is provided. The semiconductor structure includes a substrate and a dielectric layer formed over the substrate. The semiconductor structure further includes a first conductive structure formed through the dielectric layer. In addition, the first conductive structure has a concave top surface or a convex top surface, such that the concave top surface or the convex top surface of the first conductive structure is not level with the top surface of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, the method comprising:
    forming a dielectric layer over a substrate;
    forming a sacrificial layer over the dielectric layer;
    forming a trench through the sacrificial layer and the dielectric layer;
    forming a conductive material in the trench and over the sacrificial layer;
    polishing, by a first polishing process, the conductive material to form a first conductive structure until a top surface of the sacrificial layer is exposed; and
    polishing, by a second polishing process, the sacrificial layer such that a top portion of the first conductive structure protrudes from the dielectric layer after the sacrificial layer is removed, and a height of the top portion of the first conductive structure protruding from the dielectric layer is smaller than a thickness of the sacrificial layer, wherein a slurry used in the first polishing process is different from a slurry used in the second polishing process,
    wherein the first conductive structure has a convex top surface and a convex bottom surface and the substrate has a concave top surface or the first conductive structure has a concave top surface and a concave bottom surface and the substrate has a convex top surface.

2. The method for manufacturing a semiconductor structure as claimed in claim 1, further comprising:
forming an etch stop layer over the top surface and sidewalls of the top portion of the first conductive structure protruding from the dielectric layer.

3. The method for manufacturing a semiconductor structure as claimed in claim 1, wherein a polishing selectivity of the sacrificial layer to the conductive material in the second polishing process is greater than about 3.

4. The method for manufacturing a semiconductor structure as claimed in claim 1, wherein the first conductive structure has a convex top surface and a convex bottom surface.

5. The method for manufacturing a semiconductor structure as claimed in claim 1, wherein the top portion of the conductive structure protruding from the dielectric layer has substantially straight sidewalls and the convex top surface.

6. The method for manufacturing a semiconductor structure as claimed in claim 1, wherein a polishing selectivity of the sacrificial layer to the conductive material in the second polishing process is in a range from about 3 to about 7.

7. The method for manufacturing a semiconductor structure as claimed in claim 1, further comprising:
forming a second conductive structure through the sacrificial layer and the dielectric layer,
wherein a top portion of the first conductive structure and a top portion of the second conductive structure are protruded from the dielectric layer after the second polishing process is performed, and the top portion of the first conductive structure protruded from the dielectric layer is higher than the top portion of the second conductive structure protruded from the dielectric layer.

8. A method for manufacturing an interconnect structure, the method comprising:
forming a dielectric layer over a substrate;
forming a sacrificial layer over the dielectric layer;
forming a trench through the sacrificial layer and the dielectric layer;
forming a conductive material in the trench and over the sacrificial layer;
polishing, by a first polishing process, a top portion of the conductive material to form a conductive structure in the trench; and
polishing, by a second polishing process, the sacrificial layer such that a top surface of the conductive structure is not level with a top surface of the dielectric layer, wherein a slurry used in the first polishing process is different from a slurry used in the second polishing process,
wherein the substrate has a concave top surface and the conductive structure has a convex top surface or the substrate has a convex top surface and the conductive structure has a concave top surface.

9. The method for manufacturing a semiconductor structure as claimed in claim 8, wherein a polishing selectivity of the sacrificial layer to the conductive material in the second polishing process is in a range from about 3 to about 7.

10. The method for manufacturing a semiconductor structure as claimed in claim 9, wherein the top portion of the conductive material is removed by polishing the conductive material until a top surface of the sacrificial layer is exposed.

11. The method for manufacturing a semiconductor structure as claimed in claim 8, wherein a top portion of the conductive structure protrudes from the dielectric layer.

12. The method for manufacturing a semiconductor structure as claimed in claim 8, further comprising:
forming a barrier layer in the trench; and
forming a seal layer over the barrier layer before forming the conductive material,
wherein a top surface the barrier layer, a top surface of the seal layer and a top surface of the conductive material form the convex top surface of the conductive structure or wherein a top surface the barrier layer, a top surface of the seal layer and a top surface of the conductive material form the concave top surface of the conductive structure.

13. A method for manufacturing a semiconductor structure, the method comprising:
forming a dielectric layer over a substrate;
forming a sacrificial layer over the dielectric layer;
forming a first trench through the sacrificial layer and the dielectric layer;
forming a first conductive structure in the first trench;
polishing, by a first polishing process, the first conductive structure until a top surface of the sacrificial layer is exposed;
polishing, by a second polishing process, the sacrificial layer such that the first conductive structure has a convex top surface and a convex bottom surface or has a concave top surface and a concave bottom surface after the polishing process is performed;
forming a second trench through the sacrificial layer and the dielectric layer; and
forming a second conductive structure in the second trench;
wherein a top portion of the first conductive structure and a top portion of the second conductive structure are protruded from the dielectric layer after the second polishing process is performed, and the top portion of the first conductive structure protruded from the dielectric layer is higher than the top portion of the second conductive structure protruded from the dielectric layer.

14. The method for manufacturing a semiconductor structure as claimed in claim 13, wherein the second polishing process is performed at a pH value in a range from about 7 to about 11.

15. The method for manufacturing a semiconductor structure as claimed in claim 13, wherein a width of the first conductive structure is greater than a width of the second conductive structure.

16. The method for manufacturing a semiconductor structure as claimed in claim 13, further comprising:
forming a third conductive structure over the first conductive structure, wherein the third conductive structure has a convex top surface and a concave bottom surface.

17. The method for manufacturing a semiconductor structure as claimed in claim 13, further comprising:
a fourth conductive structure formed over the substrate, wherein the first conductive structure is formed over the fourth conductive structure, and the fourth conductive structure has a concave top surface in contact with the concave bottom surface of the first conductive structure.

18. The method for manufacturing a semiconductor structure as claimed in claim 13, further comprising:

forming a second trench through the sacrificial layer and the dielectric layer;
forming the conductive material in the second trench;
polishing, by the first polishing process, the conductive material to form a second conductive structure in the second trench;
polishing, by the second polishing process, the sacrificial layer such that the top portion of the second conductive structure protrudes from the dielectric layer after the sacrificial layer is removed,
wherein the top portion of the first conductive structure protruded from the dielectric layer is higher than the top portion of the second conductive structure protruded from the dielectric layer.

19. The method for manufacturing a semiconductor structure as claimed in claim 18, wherein a width of the first conductive structure is greater than a width of the second conductive structure.

* * * * *